United States Patent [19]

Hirano et al.

[11] Patent Number: 5,691,657
[45] Date of Patent: Nov. 25, 1997

[54] SAMPLE-AND-HOLD CIRCUIT INCLUDING A ROBUST LEAKAGE CURRENT COMPENSATING CIRCUIT

[75] Inventors: Yoji Hirano; Goro Ueda, both of Tokyo, Japan

[73] Assignee: NEC Corporation, Tokyo, Japan

[21] Appl. No.: 600,007

[22] Filed: Feb. 14, 1996

[30] Foreign Application Priority Data

Feb. 14, 1995 [JP] Japan .................... 7-025045

[51] Int. Cl.⁶ .................................................. G11C 27/02
[52] U.S. Cl. ................................................ 327/94; 327/96
[58] Field of Search ........................... 327/91, 94, 96, 327/53, 66, 432, 478, 482, 483, 490, 491; 323/315

[56] References Cited

U.S. PATENT DOCUMENTS

| | | | |
|---|---|---|---|
| 3,862,437 | 1/1975 | Rossell | 327/94 |
| 4,476,443 | 10/1984 | Gomi | 330/288 |
| 4,591,736 | 5/1986 | Hirao et al. | 327/91 |
| 4,806,790 | 2/1989 | Sone | 327/94 |
| 5,289,278 | 2/1994 | Bird | 327/94 |
| 5,449,960 | 9/1995 | Ohi et al. | 327/94 |
| 5,457,418 | 10/1995 | Chang | 327/94 |
| 5,463,345 | 10/1995 | Nagahori et al. | 327/491 |
| 5,467,035 | 11/1995 | Ohi et al. | 327/94 |
| 5,473,273 | 12/1995 | Werner, Jr. et al. | 327/91 |

FOREIGN PATENT DOCUMENTS

| | | | |
|---|---|---|---|
| 353014542 | 2/1978 | Japan | 327/490 |
| 1-76595 | 3/1989 | Japan . | |
| 403270407 | 12/1991 | Japan | 327/490 |
| 7-176199 | 7/1995 | Japan . | |

*Primary Examiner*—Timothy P. Callahan
*Assistant Examiner*—My-Trang Nu Ton
*Attorney, Agent, or Firm*—Foley & Lardner

[57] ABSTRACT

A sample-and-hold circuit comprises an analog signal control circuit for supplying a potential of an input signal to one end of a hold capacitor, a first transistor having a base connected to the one end of the hold capacitor and operating in an emitter follower fashion, an amplifier having a second transistor having a base connected to an emitter of the first transistor, and a leak current compensating circuit including a third transistor having an emitter connected to a collector of the first transistor and a current mirror circuit for supplying to the base of the first transistor the same current as a base current of the third transistor.

8 Claims, 9 Drawing Sheets

SAMPLE-AND-HOLD CIRCUIT INCLUDING A ROBUST LEAKAGE CURRENT COMPENSATING CIRCUIT

BACKGROUND OF THE INVENTION

1. Field of the Invention

The present invention relates to a sample-and-hold circuit for sampling and holding an instantaneous value of an analog signal, and more specifically to such a sample-and-hold circuit constituted of bipolar transistors.

2. Description of Related Art

In the case of converting an analog signal into a digital signal by means of an A/D converter (analog-to-digital converter), since a constant predetermined time is required for conversion, a potential of the analog signal to be converted is required to be maintained for the constant predetermined time. For this reason, a sample-and-hold circuit is provided at an input part of a conventional A/D converter (See Japanese Patent Application Laid-Open Publication No. Showa 64-76595 and Japanese Patent Application No. Heisei 4-71838 which was laid open as Japanese Patent Application Laid-Open Publication No. Heisei 7-176199 and which corresponds to U.S. Pat. Nos. 5,449,960 and 5,467,035; the disclosure of these publications is incorporated by reference in their entirety into the present application).

Figure 1:
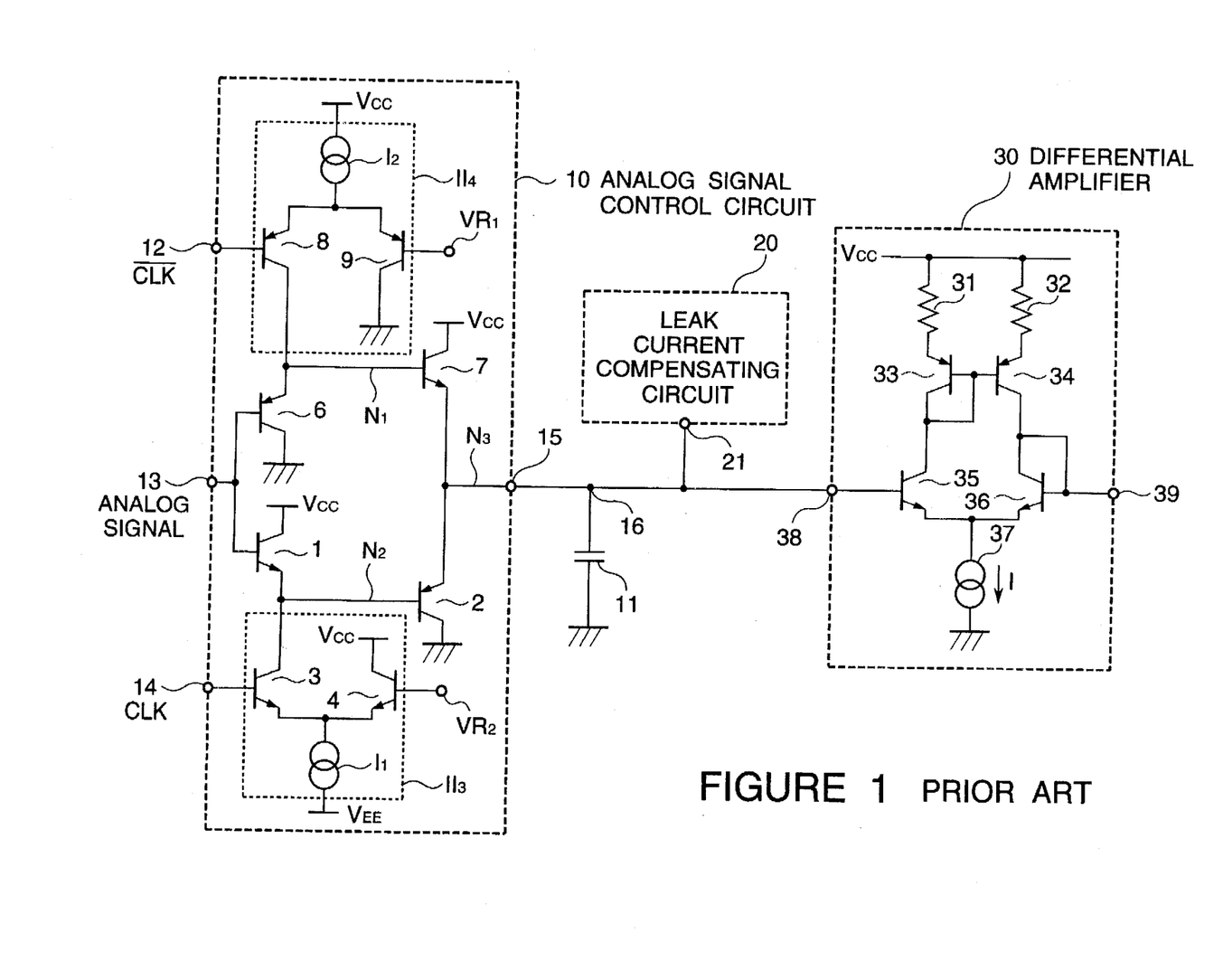
FIG. 1 is a circuit diagram of the conventional sample-and-hold circuit.

Referring to FIG. 1, there is shown a circuit diagram of the conventional sample-and-hold circuit disclosed in Japanese Patent Application Laid-Open Publication No. Showa 64-76595 and modified in accordance with Japanese Patent Application No. Heisei 4-71838.

The shown sample-and-hold circuit is configured to sample and hold an analog signal applied to an input terminal 13, in synchronism with a clock signal CLK 14 and an inverted clock signal $\overline{\text{CLK}}$ 12, and to amplify the hold signal so as to output an amplified signal to an output terminal 39. The shown sample-and-hold circuit includes an analog signal control circuit 10 receiving the clock signal CLK 14 and the inverted clock signal $\overline{\text{CLK}}$ 12, for switching over between a sampling operation and a holding operation, a hold capacitor 11 connected to an output from a terminal 15 of the analog signal control circuit 10 so as to be charged and discharge of the output of the analog signal control circuit 10, a differential amplifier 30 receiving and amplifying an output of the hold capacitor 11, and a leak current compensating circuit 20 for compensating a leak current of the hold capacitor 11 caused by an input base current of the differential amplifier 30.

The analog signal control circuit 10 includes a PNP transistor 6 and an NPN transistor 1 having their base connected in common to the input terminal 13 so as to receive the analog signal. A collector of the PNP transistor 6 is connected to a low potential power supply terminal GND, and an emitter of the PNP transistor is connected at a node $N_1$ to a constant current source circuit $II_4$ and a base of an NPN transistor 7. A collector of the NPN transistor 1 is connected to a high potential power supply terminal Vcc, and an emitter of the NPN transistor 1 is connected at a node $N_2$ to another constant current source circuit $II_3$ and a base of a PNP transistor 2. A collector of the NPN transistor 7 is connected to the high potential power supply terminal Vcc, and a collector of the PNP transistor 2 is connected to the low potential power supply terminal GND. Respective emitters of the transistors 7 and 2 are connected at a node $N_3$ in common to the terminal 15.

The constant current source circuit $II_3$ includes an NPN transistor 3 having a base connected to receive the clock signal CLK 14, another NPN transistor 4 having a base connected to a reference voltage $VR_2$ which corresponds to an intermediate level between a high level potential and a low level potential of the clock signal CLK 14, and a constant current source $I_1$ having its one end connected in common to respective emitters of the NPN transistors 3 and 4 and its other end connected to the low potential power supply terminal GND. A collector of the NPN transistor 4 is connected to the high potential power supply terminal Vcc.

The constant current source circuit $II_4$ includes a PNP transistor 8 having a base connected to receive the inverted clock signal $\overline{\text{CLK}}$ 12, another PNP transistor 9 having a base connected to a reference voltage $VR_1$ which corresponds to an intermediate level between a high level potential and a low level potential of the inverted clock signal $\overline{\text{CLK}}$ 12, and a constant current source $I_2$ having its one end connected in common to respective emitters of the PNP transistors 8 and 9 and its other end connected to the high potential power supply terminal Vcc. A collector of the PNP transistor 9 is connected to the low potential power supply terminal GND.

Now, operation of the analog signal control circuit 10 will be described. When the clock signal CLK 14 is brought to a high level, namely, the inverted clock signal $\overline{\text{CLK}}$ 12 is brought to a low level, the NPN transistor 3 and the PNP transistor 8 are turned on, respectively, so that the node $N_1$ is pulled up to a level which is higher than an input level ($D_{IN}$) applied to the input terminal 13, by a base-emitter forward direction voltage drop $V_F$ of the PNP transistor 6, and the node $N_2$ is pulled down to a level which is lower than the input level by a base-emitter forward direction voltage drop $V_F$ of the NPN transistor 2. At the same time, the node $N_3$ is clamped to a level which is lower than the level of the node $N_1$ by a base-emitter forward direction voltage drop $V_F$ of the NPN transistor 7, and which is higher than the level of the node $N_2$ by a base-emitter forward direction voltage drop $V_F$ of the PNP transistor 2. Therefore, by setting the forward direction voltage drops $V_F$ of the PNP transistors 2 and 6 equal to the forward direction voltage drops $V_F$ of the NPN transistors 1 and 7, respectively, the node 3 becomes the same potential of the input level $D_{IN}$. A period in which the above mentioned operation is performed, is called a sample mode.

On the other hand, if the clock signal CLK 14 is brought to a low level, namely, the inverted clock signal $\overline{\text{CLK}}$ 12 is brought to a high level, the node $N_1$ is isolated from the constant current source I2, so that the NPN transistor 7 is cut off. Similarly, the node $N_2$ is isolated from the constant current source $I_1$, so that the PNP transistor 2 is cut off. Therefore, the terminal 15 becomes a floating condition. A period in which this condition is maintained, is called a hold mode.

The PNP transistor 9 and the NPN transistor 4 respectively compensate for the condition that all sample-and-hold circuits do not operate when the sampling clock is supplied to none of the sample-and-hold circuits. As mentioned above, the intermediate level between the high level and the low level of the inverted clock signal $\overline{\text{CLK}}$ 12 is applied to the base of the PNP transistor 9, and the intermediate level between the high level and the low level of the inverted clock signal CLK 14 is applied to the base of the NPN transistor 4. This operation does not have a direct relation to the sample hold operation itself, and therefore, further explanation thereof will be omitted.

The terminal 15 is connected to one end 16 of the hold capacitor 11, so that the hold capacitor 11 is charged or discharged to a potential appearing on the terminal 15. As mentioned above, the potential appearing on the terminal 15 becomes the input level $D_{IN}$ in the sampling mode and becomes the floating condition in the hold mode. Therefore, the hold capacitor 11 is charged or discharged to the input level $D_{IN}$ in the sampling mode, and maintains the charged or discharged level in the hold mode. Therefore, the potential on the one end 16 of the hold capacitor 11 changes momentarily in synchronism with the clock signal CLK 14 and the inverted clock signal $\overline{\text{CLK}}$ 12.

The differential amplifier 30 receives at an input terminal 30 the hold voltage maintained in the hold capacitor 11, and amplifies the received voltage so as to output an amplified voltage to the output terminal 39. The differential amplifier 30 includes an NPN transistor 35 having a base connected to the terminal 38, another NPN transistor 36 having an emitter connected to an emitter of the NPN transistor 35, a constant current source 37 connected in common to the respective emitters of the transistors 35 and 36 and having a current value I, a resistor 31 and a PNP transistor 33 connected to a collector of the transistor 35 so as to constitute an active load, and a resistor 32 and a PNP transistor 34 connected to a collector of the transistor 36 so as to constitute an active load. The transistors 35 and 36 operate an differential input transistors of the differential amplifier 30. Respective bases of the transistors 33 and 34 are connected to each other, and the base of the transistor 33 is connected to the collector of the transistor 33. Thus, the transistors 33 and 34 operates as the active load in such a manner that a current mirror current of the collector current of the transistor 33 flows as the collector current of the transistor 34. The collector of the transistor 36 is connected to a base of the transistor 36 itself in a feedback fashion.

In the differential amplifier 30 having the above mentioned structure, a half of the current I of the constant current source 37 (namely, I/2) flows through each of the input transistor 35 and the transistor 36. Namely, a current obtained by dividing I/2 by a current amplification factor β, flows as a base current of the transistor 35. Thus, electric charges accumulated in the hold capacitor 11 decrease because of the above mentioned base current of the transistor 35. In order to compensate the decrease of the electric charges, the leak current compensating circuit 20 is connected to the one end 16 of the hold capacitor 11. A structure of the leak current compensating circuit 20 is shown in FIG. 2.

Figure 2:
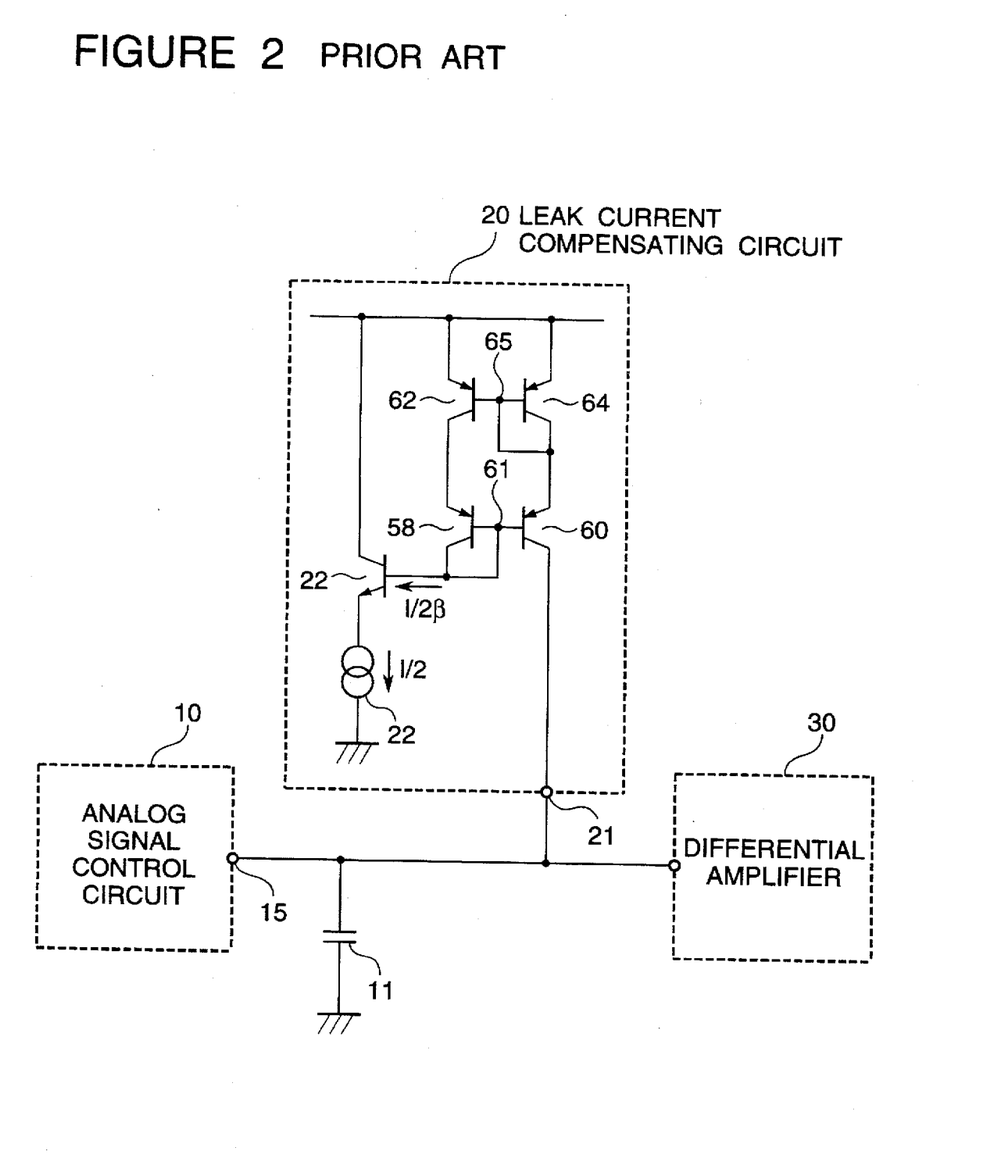
FIG. 2 is a circuit diagram of the leak current compensating circuit used in the conventional sample-and-hold circuit shown in FIG. 1.

Referring to FIG. 2, the leak current compensating circuit 20 includes a transistor 22 equivalent to the transistor 35. The transistor 22 has an emitter connected to a constant current source 56 flowing a constant current I/2. Therefore, the same current as the base current (I/2β) of the transistor 35 flows in a base of the transistor 22. This current I/2β is taken from a terminal 21 through a current mirror circuit 61 composed of transistors 58 and 60 anc another current mirror circuit 65 composed of transistors 62 and 64, and then, is supplied to the base of the transistor 35. As a result, the leak current of the hold capacitor 11 caused by the base current of the transistor 35 of the differential amplifier 30 is compensated for by the leak current compensating circuit 20, so that the sample-and-hold circuit composed of bipolar transistors can precisely operate.

In the above mentioned conventional example, as mentioned above, the compensation is realized by making the base current of the base current generating transistor 22 of the leak current compensating circuit 20 to I/2β. However, the base current of the transistor 22 is influenced by base currents of the transistors 33 and 34 of the differential amplifier 30 and also influenced by manufacturing variations of the base-emitter forward direction voltage drop of the transistors 35 and the base-emitter forward direction voltage drop of the transistor 36. Furthermore, the base current of the transistor 22 is influenced by the Early effect based on a difference between a collector-emitter voltage of the transistor 35 and a collector-emitter voltage of the transistor 36. As a result, the base current of the transistor 22 deviates from I/2β, so that the sample-and-hold circuit having a high degree of precision can be realized.

In addition, the constant current source having the current value of I/2 is required in the leak current compensating circuit 20, and therefore, the consumed electric power is inevitably large.

SUMMARY OF THE INVENTION

Accordingly, it is an object of the present invention to provide a sample-and-hold circuit which has overcome the above mentioned defect of the conventional one.

Another object of the present invention is to provide a sample-and-hold circuit having a high degree of precision, by accurately compensating of the leak current of the hold capacitor, without substantially increasing the consumed electric power.

The above and other objects of the present invention are achieved in accordance with the present invention by a sample-and-hold circuit comprising a first means for supplying a potential of an input signal to one end of a hold capacitor, a transistor having a base connected to the one end of the hold capacitor and operating in an emitter follower fashion, an amplifier having an input connected to an emitter of the transistor, and a second means for supplying a base current to the base of the transistor.

With this arrangement, the amplifier does not receive directly the potential of the hold capacitor which accumulates electric charges, but receives the potential of the hold capacitor through the transistor operating in the emitter follower fashion. Therefore, a leak current compensating circuit can compensate the leak current with a high degree of precision, without being influenced by the amplifier. In addition, since a collector current of the transistor can be used directly for compensating the leak current, it is no longer necessary to use the constant current source in the leak current compensating circuit.

The above and other objects, features and advantages of the present invention will be apparent from the following description of preferred embodiments of the invention with reference to the accompanying drawings.

DESCRIPTION OF THE PREFERRED EMBODIMENTS

Figure 3:
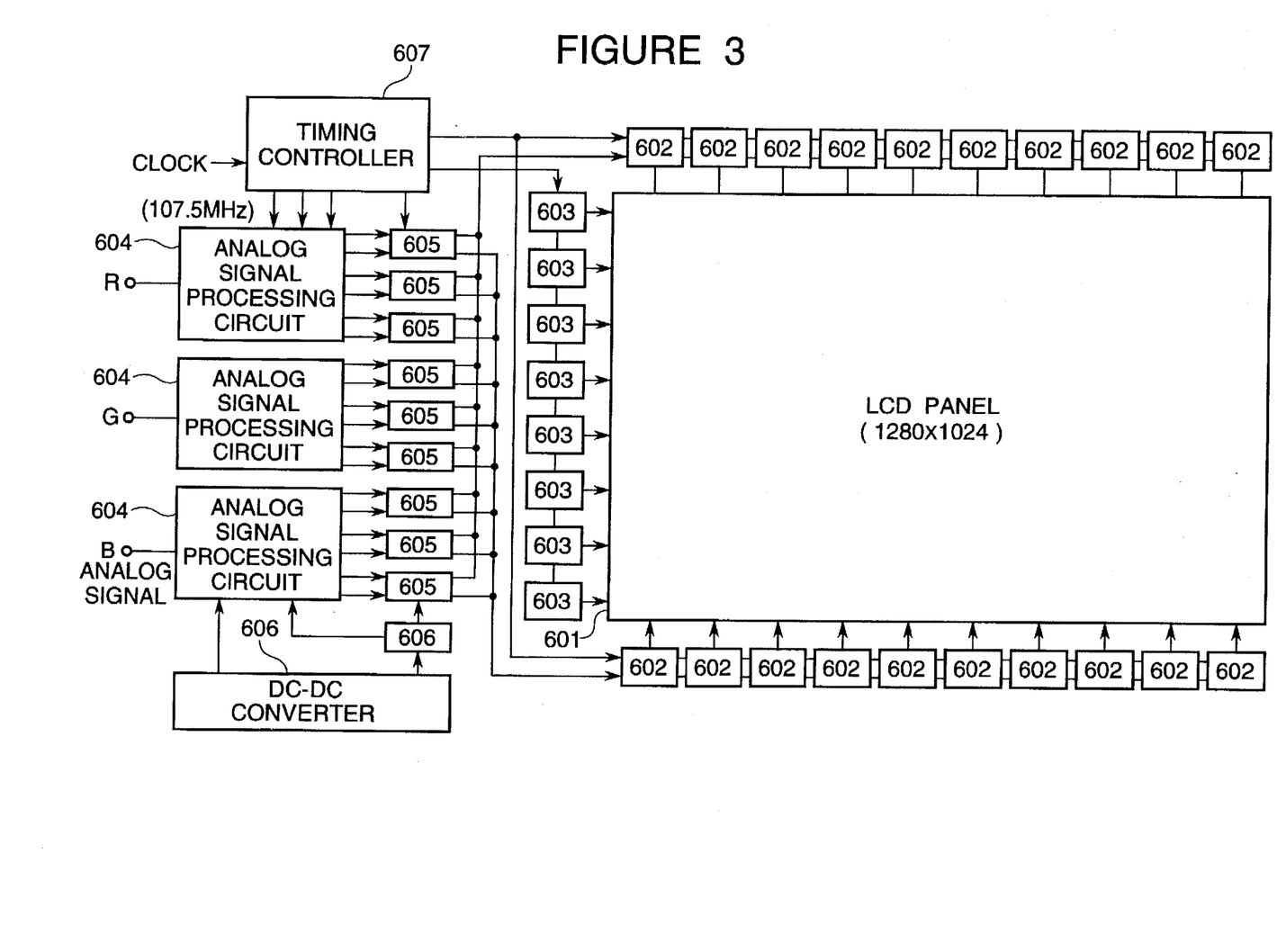
FIG. 3 is a block diagram of one example of a liquid crystal display in which the sample-and-hold circuit is incorporated.

Referring to FIG. 3, there is shown a block diagram of one example of a liquid crystal display, which is one of a number of different fields in which the sample-and-hold circuit can be applied. The liquid crystal display was firstly used as a display of a handy electronic calculator and a digital watch, and use of the liquid crystal display is currently rapidly spreading as the display of a person computer, a television receiver and a word processor.

Of various liquid crystal displays, attention is now focused onto an active matrix type of liquid crystal display in which each of pixels arranged in the form of a matrix in the liquid crystal is associated with an active element such as a transistor or a diode for one kind of memory operation, so that a high quality image having a good contrast ratio can be realized. Namely, the active element acts an on-off switch so that a display signal is transferred through the active element selected (namely, turned on) by an operation signal, to a corresponding pixel. Therefore, the selected active element is returned into a non-selected condition or an off condition, the display signal applied to the pixel is held in the respective pixel in the form of an electric charge, so as to ceaselessly drive the liquid crystal. As a result, the liquid crystal excellently reproduces the static characteristics, and a high density of pixels can be realized.

Referring to FIG. 3, the shown liquid crystal display includes a LCD (liquid crystal display) panel 601 having active elements of 1,280 rows×1,024 columns, a plurality of source drivers 602 for transferring the display signal to the active elements of the LCD panel 601, a plurality of gate drivers 603 for transferring the operation signal for on-off controlling the active elements, three analog signal processing circuits 604 receiving analog signals of R, G and B, respectively, for processing the received analog signal by an internally provided sample-and-hold circuit for the purpose of generating the display signal for the display device, data inverting circuits 605 generating an inverted signal of the analog signals of R, G and B, so as to supply the inverted signals to the source drivers 602, a DC-DC converter 606 controlling a DC level of the analog signal processing circuits 604 and the data inverting circuits 605, and a timing controller 607 for controlling respective timings of the source drivers 602, the gate drivers 603, the data inverting circuit 605 and the analog signal processing circuits 604. This liquid crystal display operates with a high speed clock of for example 107.5 MHz. Therefore, the analog signal processing circuits 604 are required to operate at a high speed. Accordingly, the sample-and-hold circuit internally provided in the analog signal processing circuits 604 is required to operate at a high speed.

Figure 4:
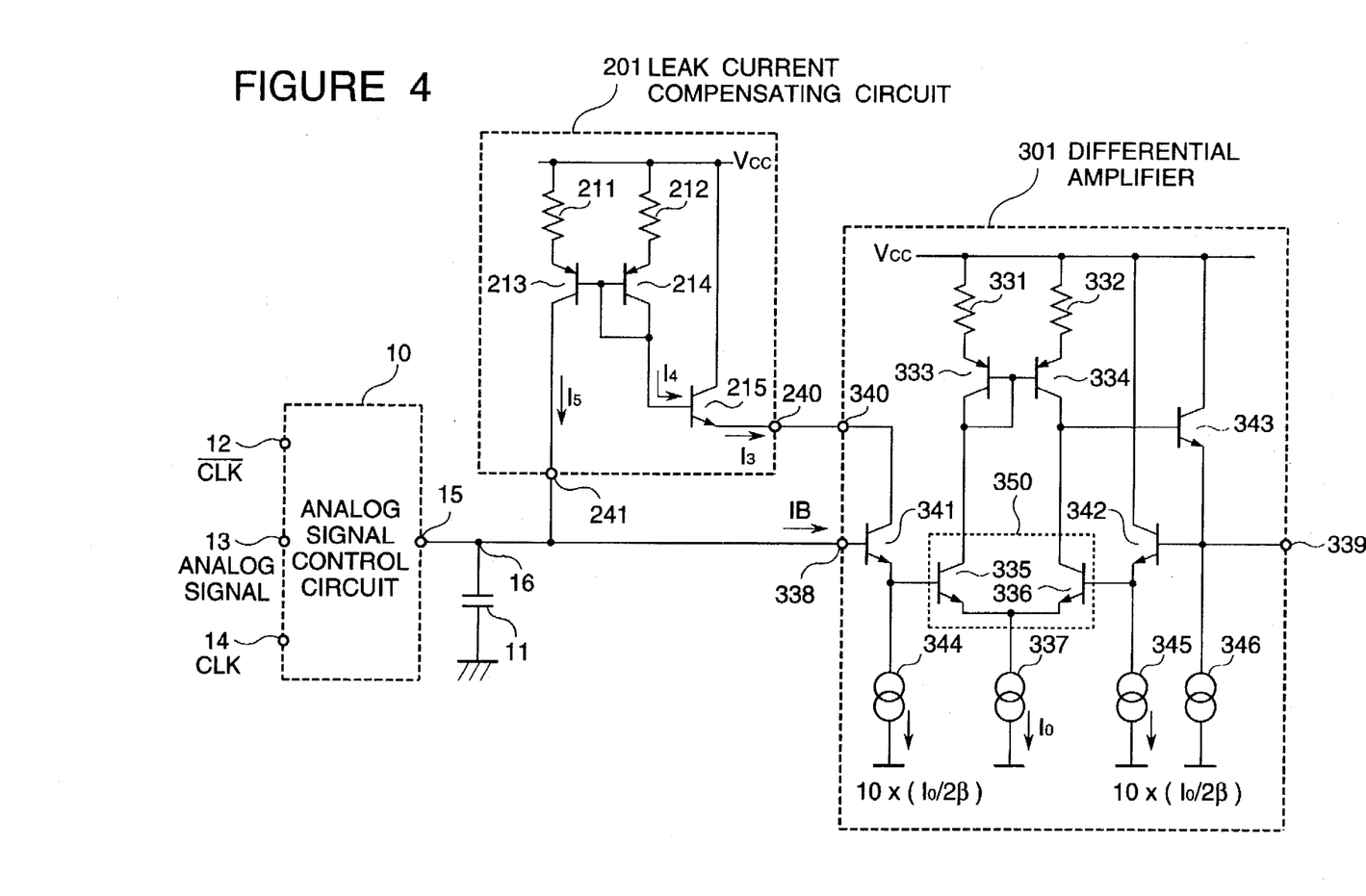
FIG. 4 is a circuit diagram of a first embodiment of the sample-and-hold circuit in accordance with the present invention.

Referring to FIG. 4, there is shown a circuit diagram of a first embodiment of the sample-and-hold circuit in accordance with the present invention. The first embodiment of the sample-and-hold circuit includes an analog signal control circuit 10 selecting either a sampling operation or a holding operation for an analog signal supplied to an input terminal 13, in synchronism with the clock signal CLK 14 and the inverted clock signal $\overline{CLK}$ 12, and a hold capacitor 11 connected to receive and hold a potential appearing on a terminal 15 of the analog signal control circuit 10, a differential amplifier 301 having an input terminal 338 receiving the potential held in the hold capacitor 11, and a leak current compensating circuit 201 for compensating a leak current of the hold capacitor 11. The analog signal control circuit 10 has the same construction as that of the corresponding one of the conventional example shown in FIG. 1, and the hold capacitor 11 is the same as the corresponding one of the conventional example shown in FIG. 1. Therefore, explanation of the analog signal control circuit 10 and the hold capacitor 11 will be omitted, and a construction and an operation of only the leak current compensating circuit 201 and the differential amplifier 301 will be described in the following.

The differential amplifier 301 has the input terminal 338 for receiving the potential held in the hold capacitor 11 and an output 339 for outputting an amplified received potential. The differential amplifier 301 includes an NPN bipolar transistor 341 having a base connected to the input terminal 338, a collector connected to a terminal 340 and an emitter connected to a constant current source 344, so as to constitute an emitter follower, and a differential pair composed of an NPN transistor 335 having a base connected to a connection node between the transistor 341 and the constant current source 344, and another NPN transistor 336 having an emitter connected to an emitter of the NPN transistor 335 and a constant current source 337. The differential amplifier 301 also includes an NPN bipolar transistor 342 having the same characteristics as that of the transistor 341 and having an emitter connected to a base of the transistor 336 and an emitter connected to an constant current source 345 so as to constitute an emitter follower, a resistor 331 and a PNP transistor 333 connected to a collector of the transistor 335 so as to constitute an active load, a resistor 332 and a PNP transistor 334 connected to a collector of the transistor 336 so as to constitute an active load, and an NPN bipolar transistor 343 having a base connected to a connection node between a collector of the transistor 334 and a collector of the transistor 336, an emitter connected to a base of the transistor 342, the output terminal 339 and a constant current source 346, so as to feed back the output of the output terminal 339.

On the other hand, the leak current compensating circuit 201 includes an NPN bipolar transistor 215 for detecting a collector current of the transistor 341 which operates in the emitter follower fashion in the differential amplifier 301. A collector of the transistor 215 is connected to a high potential power supply voltage Vcc, and an emitter of the transistor 215 is connected through a terminal 240 to the terminal 340, which is connected to the collector of the transistor 341, so as to supply the collector current to the transistor 341 operating in the emitter follower. In order to supply a base current to the transistor 215, there is provided a current mirror circuit which includes a PNP transistor 214 having a base and a collector connected to the base of the transistor 215, a resistor 212 connected between an emitter of the transistor 214 and the high potential power supply voltage Vcc, another PNP transistor 213 having a base connected to the base of the transistor 214, and a resistor 211 connected between an emitter of the transistor 213 and the high potential power supply voltage Vcc. An output current of this current mirror circuit is connected through a terminal 241 to the one end 16 of the hold transistor 11.

Now, operation of the sample-and-hold circuit of the first embodiment will be described.

As mentioned above, the analog signal control circuit 10 is the same in construction and in operation as the analog signal control circuit 10 of the conventional example shown in FIG. 1. Namely, when the clock signal CLK 14 is at a high level and the inverted clock signal $\overline{CLK}$ 12 is a low level, it is in the sampling mode that the hold capacitor 11 is charged or discharged by the level of the analog signal applied to the input terminal 13. When the clock signal CLK 14 is at a low level and the inverted clock signal $\overline{CLK}$ 12 is a high level, it is in the hold mode that the electric change accumulated in the hold capacitor 11 is maintained irrespectively of the level of the analog signal applied to the input terminal 13.

Returning to FIG. 4, the transistor 341 in the differential amplifier 301 receives at its base the potential of the one end 16 of the hold capacitor 11 and operates in the emitter follower fashion, so that the potential of the one end 16 of the hold capacitor 11 is applied to the base of transistor 335 of the differential pair 350 after it is level-shifted by a base-emitter forward direction voltage drop ($V_F$) of the transistor 341. By action of the active load composed of the transistors 333 and 334, an equal current flows through the respective emitters of the transistors 335 and 336. Namely, a half of the current value $I_0$ of the constant current source 337 flows through each of the transistors 335 and 336.

On the other hand, the constant current source 344 and 345 are set to have a current supply capacity capable of sufficiently supplying the base current of the transistors 335 and 336, namely, a current value $I_0/2\beta$, assuming that the current amplification factor of the transistors 335 and 336 is $\beta$. Specifically, the constant current source 344 and 345 are set to have the current supply capacity capable of sufficiently supplying a current of several to ten times of the current value $I_0/2\beta$. In addition, the constant current source 346 is set to have a current supply capacity capable of sufficiently supplying a current of several times to ten and several times of the base current of the transistor 342. Accordingly, the collector current of the transistor 335 becomes equal to the collector current of the transistor 336, so that the collector potential of the transistor 336 is supplied through the emitter follower transistor 343 to the base of the transistor 342, and therefore, the emitter potential of the transistor 342 is fed back to the base of the transistor 336. Thus, the potential of the terminal 338 becomes completely equal to the potential of the terminal 339. Namely, the potential of the one end 16 of the hold capacitor 11 is outputted from the output terminal 339.

As mentioned above, the current value of the constant current source 344 is so set that a current, which is several times to ten times the base current value $I_0/2\beta$ of the transistor 335, flows through the emitter of the input emitter follower transistor 342 of the differential amplifier 301. On the other hand, bipolar transistors ordinarily used has the current amplification factor $\beta$ on the order of 100. Therefore, if the current value of the constant current source 344 is compared with the current value I/2 of the constant current source provided in the leak current compensating circuit 20 of the conventional example, the current value of the constant current source 344 is reduced to $1/10$ to $1/30$. Accordingly, the current flowing through the transistor 341 is on the order of $1/10$ to $1/30$ of the flowing through the transistor 22 of the leak current compensating circuit 20 of the conventional example.

Next, operation of the leak current compensating circuit 201 will be described. The current of the constant current source 344 in the differential amplifier 301 flows from the transistor 215 through the terminals 240 and 340 to the transistor 341. Therefore, an emitter current $I_3$ of the transistor 215 is substantially equal to the emitter current of the transistor 341. Accordingly, a base current IB of the transistor 341 becomes substantially equal to the base current $I_4$ of the transistor 215. Since this current $I_4$ is applied to the current mirror circuit, a current $I_5$ substantially equal to the current $I_4$ is outputted from the terminal 241 to be supplied to the base of the transistor 341, by action of the current mirror circuit, although the current $I_4$ contains the base currents of the transistors 213 and 214. As a result, the leak of the hold capacitor 11 caused by the base current of the transistor 341 is compensated by the current $I_5$ of the leak current compensating circuit, and therefore, the sample-and-hold circuit operates with an excellent precision.

Now, the above explanation will be repeated using equations on the basis of the current values indicated in FIG. 1 and the current amplification factor of the transistor.

$$IB=I_3/\beta \qquad (1)$$

$$I_4=I_3/(\beta+1) \qquad (2)$$

Accordingly, the relation between the base current $I_4$ of the transistor 215 and the base current IB of the transistor 341 can be expressed as follows:

$$I_4=\{\beta/(1+\beta)\}\cdot IB=\{1/(1+(1/\beta))\}\cdot IB \qquad (3)$$

By action of the current mirror circuit composed of the transistors 213 and 214, the relation between the base current $I_4$ of the transistor 215 and the compensating current $I_5$ can be expressed as follows:

$$I_4=I_5+(2\cdot I_5/\beta) \qquad (4)$$

therefore, $$I_5=\{1/(1+(2/\beta))\}\cdot I_4 \qquad (5)$$

Accordingly, the relation between the compensating current $I_5$ and the base current IB of the transistor 341 is expressed as follows:

$$I_5=\{1/[(1+(2/\beta))\cdot(1+(1/\beta))]\}\cdot IB \qquad (6)$$

This equation (6) can be converted as follows:

$$I_5=\{1/[1+(3/\beta)+(2/\beta^2)]\}\cdot IB \qquad (7)$$

As mentioned above, since the current amplification factor $\beta$ of the ordinary used bipolar transistor is on the order of 100, $(2/\beta^2)\approx 0$ and therefore, it becomes $I_5=\{1/(1+0.03)\}\cdot IB$. The base current can substantially completely compensated for with only an error of about 3%.

As mentioned above, since the current flowing through each of the constant current sources 344, 345 and 346 is extremely smaller than the current $I_0$ flowing through the constant current source 337, the consumed electric power is considerably smaller than the conventional example.

Now, a second embodiment of the sample-and-hold circuit in accordance with the present invention will be described with reference to FIG. 5, in which elements similar to those shown in FIG. 4 are given the same Reference Numerals, and explanation thereof will be omitted.

The second embodiment of the sample-and-hold circuit in accordance with the present invention is configured to compensate for the leak current at a further high degree of precision, by substantially eliminating the influence of the respective base currents of the transistors 213 and 214 of the current mirror from the compensating current $I_5$ of the leak current compensating circuit 201 in the first embodiment of the sample-and-hold circuit.

Figure 5:
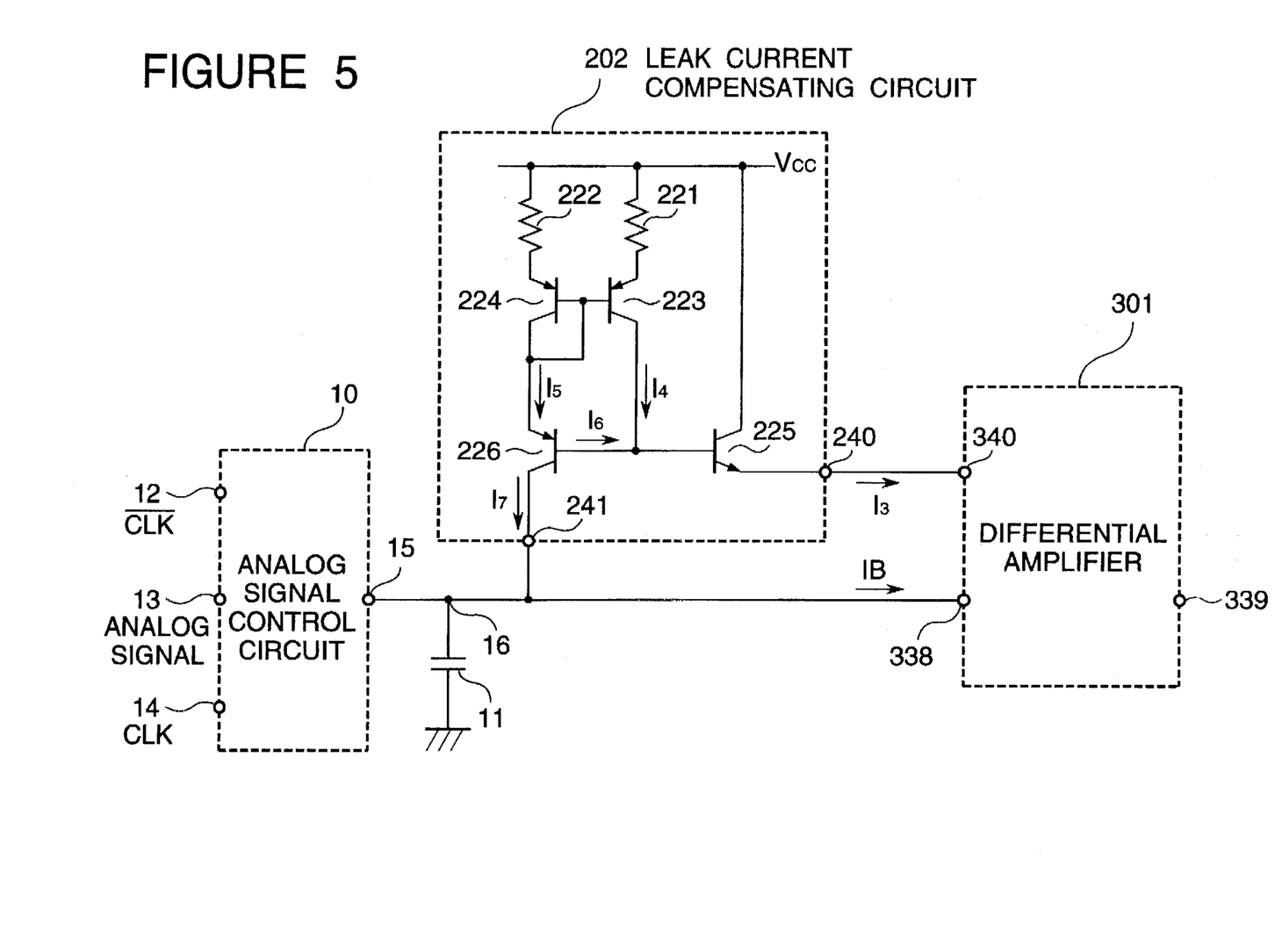
FIG. 5 is a circuit diagram of a second embodiment of the sample-and-hold circuit in accordance with the present invention.

As seen from comparison between FIGS. 4 and 5, the second embodiment of the sample-and-hold circuit in accordance with the present invention includes a leak current compensating circuit 202 in place of the leak current compensating circuit 201.

The leak current compensating circuit 202 includes an NPN bipolar transistor 225 for detecting the collector current of the emitter follower transistor 341 in the differential amplifier 301. A collector of the transistor 225 is connected to a high potential power supply voltage Vcc, and an emitter of the transistor 225 is connected through the terminal 240 to the terminal 340, so as to supply the collector current to the transistor 341 operating in the emitter follower fashion.

In order to supply a base current to the transistor 225, there is provided a current mirror circuit which includes a resistor 221 having one end connected to the high potential power supply voltage Vcc, a PNP transistor 223 having an emitter connected to the other end of the resistor 221, a resistor 222 having one end connected to the high potential power supply voltage Vcc, a PNP transistor 224 having an emitter connected to the other end of the resistor 222 and a base and a collector connected to the base of the transistor 223. Furthermore, the leak current compensating circuit 202 includes a PNP transistor 226 having a base connected to the collector of the transistor 223, so that a base current $I_6$ of the transistor 226 is suppled together with a collector current $I_4$ of the transistor 223 to the base of the transistor 225 as a base current. An emitter of the PNP transistor 226 is connected to the collector of the transistor 224. A collector of the transistor 226 is connected through the terminal 241 to the one end 16 of the hold capacitor 11.

Now, a leak current compensating operation in the second embodiment will be described with reference to the leak current compensating circuit 202.

Similarly to the first embodiment, the base current of the transistor 341 of the differential amplifier 301 is substantially equal to the base current of the transistor 225 in the leak current compensating circuit 202. Namely, the leak current IB of the hold capacitor 11 is equal to a sum of the current $I_4$ and the current $I_6$. On the other hand, an emitter current $I_5$ of the transistor 226 is the current $I_4$ added with a base current of the transistor 223 and a base current of the transistor 224. Therefore, by setting the base current $I_6$ of the transistor 226 receiving this current $I_5$, equal to the base current of the transistor 223 or 224, a collector current of the transistor 226 becomes completely equal to a sum of the current $I_4$ and the current $I_6$. Namely, the current $I_7$ becomes substantially coincident with the leak current IB, it is possible to compensate for the leak current at a greatly excellent degree of precision.

Here, explanation will be made by using equations.

$$IB=I_3/\beta \tag{8}$$

$$I_4+I_6=I_3/(\beta+1) \tag{9}$$

Accordingly, the relation between the base current $(I_4+I_6)$ of the transistor 225 and the base current IB of the transistor 341 is expressed as follows:

$$I_4+I_6=\{1/[1+(1/\beta)]\}\cdot IB \tag{10}$$

By action of the current mirror circuit composed of the transistors 223 and 224,:

$$I_5=I_4+2\cdot(I_4/\beta) \tag{11}$$

therefore, $$I_4=I_5/\{1+(2/\beta)\} \tag{12}$$

Here, since the current $I_5$ is the emitter current of the transistor 226, $$I_6=I_5/(1+\beta) \tag{13}$$

If the equation (10) is converted by using the equations (12) and (13), the left side of the equation (10) can be expressed as follows:

$$\begin{aligned}I_4+I_6 &= \{I_5/[1+(2/\beta)]\}+\{I_5/(1+\beta)\} \\ &= I_5 \cdot \{[\beta/(2+\beta)]+[1/(1+\beta)]\} \\ &= I_5 \cdot (2+2\beta+\beta^2)/\{(1+\beta)\cdot(2+\beta)\}\end{aligned} \tag{14}$$

On the other hand, the right side of equation (10) can be expressed as follows:

$$\{1/[1+(1/\beta)]\}\cdot IB=[\beta/(1+\beta)]\cdot IB \tag{15}$$

Accordingly, the following equation can be obtained from the equations (14) and (15)

$$I_5\cdot(2+2\beta+\beta^2)/(2+\beta)=\beta\cdot IB \tag{16}$$

In addition, since the current $I_5$ is the emitter current of the transistor 226 and the current $I_7$ is the collector current of the transistor 226, $$I_7=\{\beta/(1+\beta)\}\cdot I_5$$

therefore, $$I_5=\{(1+\beta)/\beta\}\cdot I_7 \tag{17}$$

if the equation (17) is substituted into the equation (16), $$I_7\cdot\{(1+\beta)\cdot(2+2\beta+\beta^2)/[\beta\cdot(2+\beta)]\}=\beta\cdot IB$$

Accordingly, $$I_7\cdot\{(1+\beta)\cdot(2+2\beta+\beta^2)/[\beta^2\cdot(2+\beta)]\}=IB \tag{18}$$

if the numerator and the denominator of the left side are divided by $\beta^2$, the equation (18) can be converted as follows:

$$I_7\cdot\{(1+\beta)\cdot(2/\beta^2+2/\beta+1)/(2+\beta)\}=IB \tag{19}$$

Here, since $\beta=100$, $2/\beta^2$ is approximated to be zero ($2/\beta^2=0$), and therefore, the equation (19) can be expressed as follows:

$$I_7\cdot\{(1+\beta)\cdot(2+\beta)/[\beta\cdot(2+\beta)]\}=IB$$

accordingly, $$I_7\cdot\{(1+\beta)/\beta\}=IB \tag{20}$$

Therefore, assuming $\beta=100$, the compensating current value $I_7$ becomes as follows:

$$I_7=\{100/(1+100)\}\cdot IB \tag{21}$$

Thus, the base current of the transistor 341 can precisely compensated for with only an error of about 1%. Accordingly, the leak current compensating circuit 202 of the second embodiment can compensate for the base current at a degree of precision which is higher than that of the leak current compensating circuit 201 of the first embodiment. In addition, the consumed electric power does not increase.

Now, a third embodiment of the sample-and-hold circuit in accordance with the present invention will be described with reference to FIG. 6, in which elements similar to those shown in FIG. 4 are given the same Reference Numerals, and explanation thereof will be omitted.

The third embodiment of the sample-and-hold circuit in accordance with the present invention is configured to have a leak current compensating circuit having a response speed higher than that of the leak current compensating circuit 201 in the first embodiment of the sample-and-hold circuit.

Figure 6:
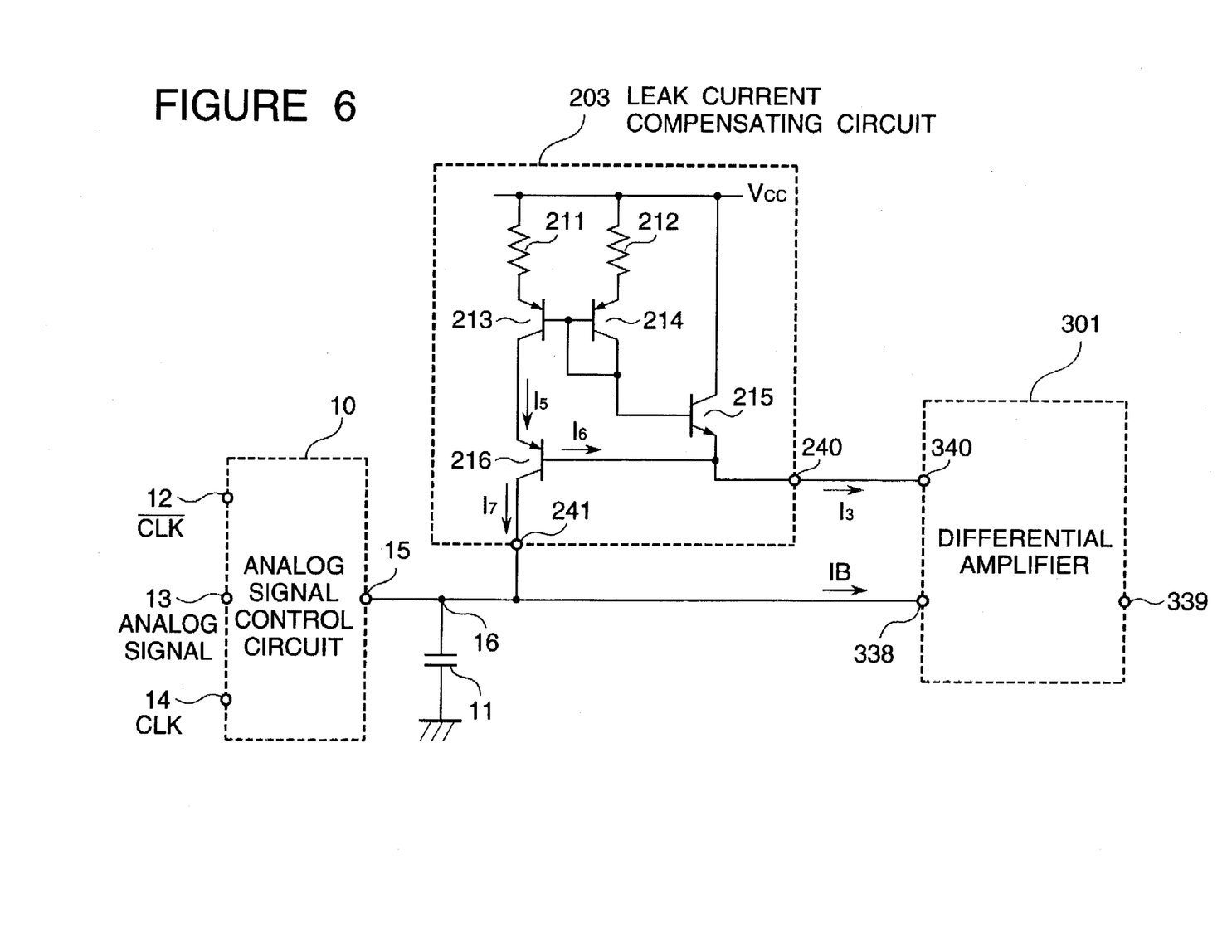
FIG. 6 is a circuit diagram of a third embodiment of the sample-and-hold circuit in accordance with the present invention.

As seen from comparison between FIGS. 4 and 6, the third embodiment of the sample-and-hold circuit in accordance with the present invention includes a leak current compensating circuit 203 in place of the leak current compensating circuit 201.

The leak current compensating circuit 203 is different from the leak current compensating circuit 201 only in that a transistor 216 is added which has an emitter connected to the collector 213, a base connected to the emitter of the transistor 215, and a collector connected to the terminal 241, so that a compensating current $I_7$ is supplied from the collector of the transistor 216.

The collector current $I_5$ of the transistor 213 is an emitter current of the transistor 216, and a base current $I_6$ of the transistor 216 is caused to flow through the terminals 240 and 340 to the collector of the transistor 341. Therefore, this base current $I_6$ influences the base current IB of the transistor 341 on only such a degree of $I_5 \times (1/\beta)$ assuming that the current amplification factor is $\beta$. Accordingly, the collector current $I_7$ of the transistor 216 is subjected to influence corresponding to three base currents, namely the respective base currents of the transistors 213 and 214 and the base current of the transistor 216.

Thus, the degree of precision in compensating the base current drops at some degree in comparison with the leak current compensating circuit 201, but the leak current compensating circuit 203 can quickly compensate the leak current by action of the transistor 216.

Now, a fourth embodiment of the sample-and-hold circuit in accordance with the present invention will be described with reference to FIG. 7, in which elements similar to those shown in FIGS. 4 and 5 are given the same Reference Numerals, and explanation thereof will be omitted.

Figure 7:
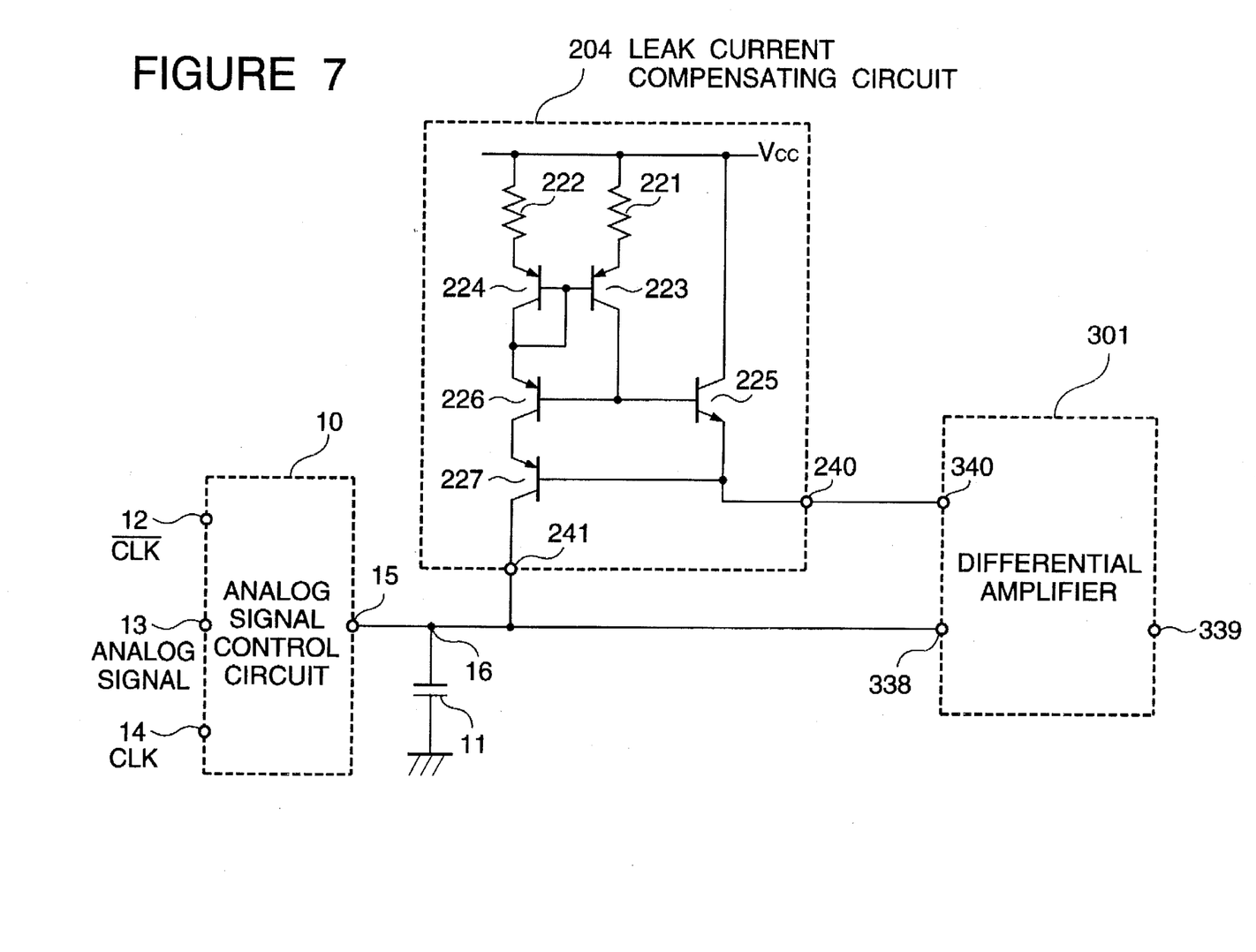
FIG. 7 is a circuit diagram of a fourth embodiment of the sample-and-hold circuit in accordance with the present invention.

The fourth embodiment of the sample-and-hold circuit in accordance with the present invention is configured to prevent the base currents of the two transistors of the current mirror circuit from influencing the base current compensation of the transistor 341, similarly to the leak current compensating circuit 202 of the second embodiment, and also to have a leak current compensating circuit having a high response speed, similarly to the leak current compensating circuit 203 in the third embodiment, As seen from comparison between FIGS. 4 and 7, the fourth embodiment of the sample-and-hold circuit in accordance with the present invention includes a leak current compensating circuit 204 in place of the leak current compensating circuit 201.

The leak current compensating circuit 204 is different from the leak current compensating circuit 202 only in that a transistor 227 is added which has an emitter connected to the collector 226, a base connected to the emitter of the transistor 225, and a collector connected to the terminal 241, so that a compensating current $I_7$ is supplied from the collector of the transistor 227.

Similarly to the second embodiment, the collector current of the transistor 226 is equal to the base current IB of the transistor 341. In addition, the transistor 227 correspond to the transistor 216 in the third embodiment. Therefore, the degree of precision in the leak compensating current $I_7$ is lower than the second embodiment at some degree. The degree of precision in the leak compensating current $I_7$ is at an intermediate level between the first embodiment and the second embodiment. However, the leak current compensating circuit 204 can quickly compensate the leak current by action of the transistor 227.

Now, a fifth embodiment of the sample-and-hold circuit in accordance with the present invention will be described with reference to FIG. 8, in which elements similar to those shown in FIGS. 4 and 7 are given the same Reference Numerals, and explanation thereof will be omitted.

The fifth embodiment of the sample-and-hold circuit in accordance with the present invention is configured to eliminate the influence of the base currents of the transistors 223 and 224 of the current mirror in the leak current compensating circuit 204 in the fourth embodiment of the sample-and-hold circuit configured to realize a high speed leak current compensating operation.

Figure 8:
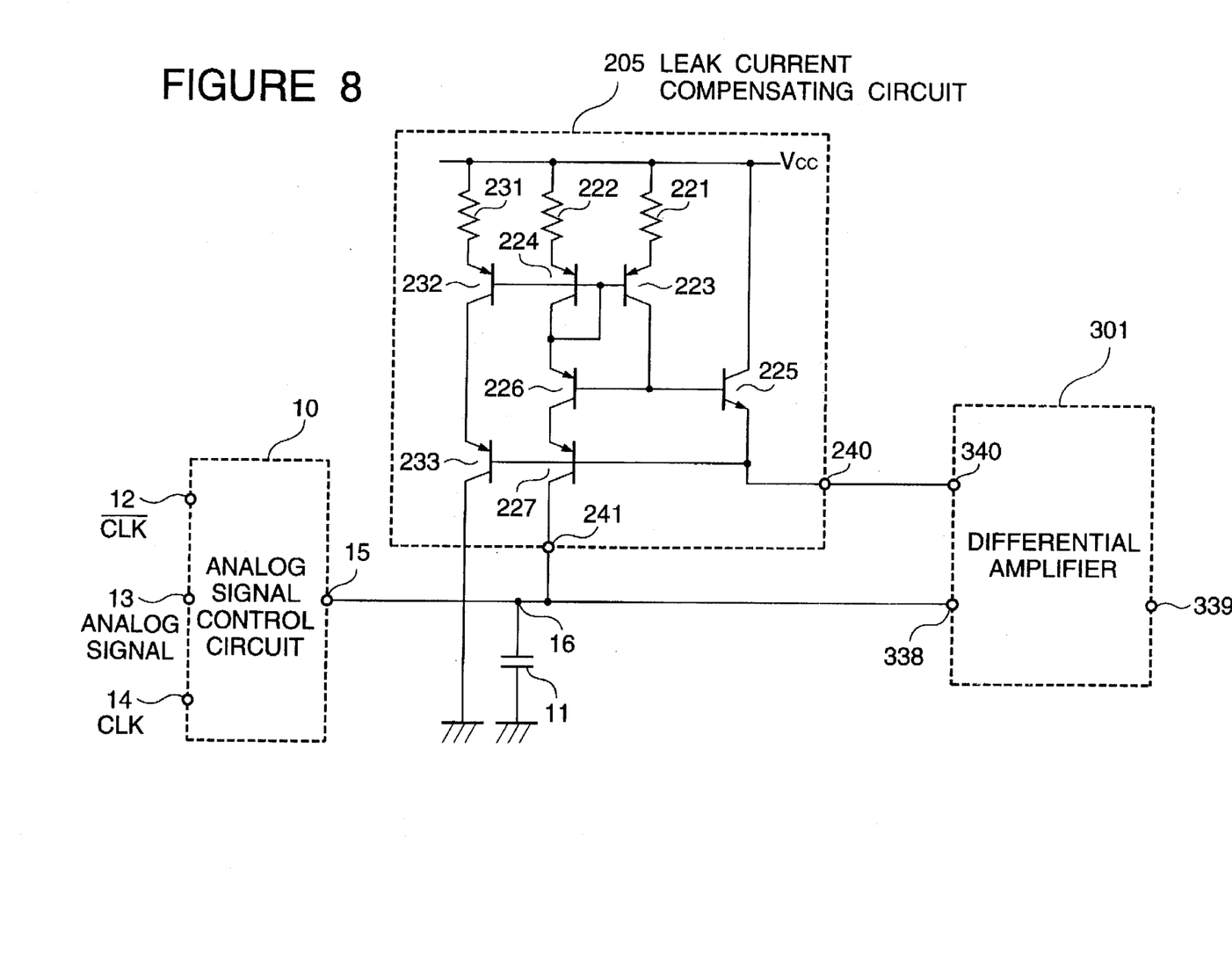
FIG. 8 is a circuit diagram of a fifth embodiment of the sample-and-hold circuit in accordance with the present invention.

As seen from comparison between FIGS. 7 and 8, the fifth embodiment of the sample-and-hold circuit in accordance with the present invention includes a leak current compensating circuit 205 in place of the leak current compensating circuit 204. The leak current compensating circuit 205 includes a transistor 232 completely equivalent to the transistors 223 and 224 in order to completely eliminate the influence of the base currents of the transistors 223 and 224 from the leak compensating current A base of the transistor is connected to the base of the transistors 223 and 224 which constitute the current mirror circuit, and a resistor 231 completely equivalent to the resistors 221 and 222 is connected between an emitter of the transistor 232 and the high potential power supply voltage Vcc. In addition, the leak current compensating circuit 205 includes a transistor 233 having an emitter connected to a collector of the transistor 232, a base connected to the base of the transistor 227 and a collector connected to the ground GND, in order to prevent an Early effect caused by a bias voltage $V_{CE}$ between the collector and the emitter of the transistor 232.

Now, the leak current compensating operation of the fifth embodiment will be described. As mentioned above in connection with the third embodiment, the compensating current cannot completely the base current IB of the transistor 341 because of the base current of the transistor 227 provided for realizing the high speed response. Therefore, the sample-and-hold circuit of the fifth embodiment is so configured that a base current of the transistor 232 compensates for the base current of the transistor 227, whereby the leak current can be compensated for with a high degree of precision.

The collector of the transistor 232 may be connected directly to the ground, but it is preferred to provide the transistor 233 in order to make the Early effect caused by the collector-emitter bias of the transistor 232 substantially coincident with the collector-emitter bias of the transistor 223 or 224.

Therefore, the leak current compensating circuit 205 of the fifth embodiment can realize a high speed response and also can compensate for the base current IN of the transistor 341 with an extremely high degree of precision. Accordingly, the sample-and-hold having a high speed and a high precision can be obtained.

Now, a sixth embodiment of the sample-and-hold circuit in accordance with the present invention will be described with reference to FIG. 9, in which elements similar to those shown in FIG. 4 are given the same Reference Numerals, and explanation thereof will be omitted.

Figure 9:
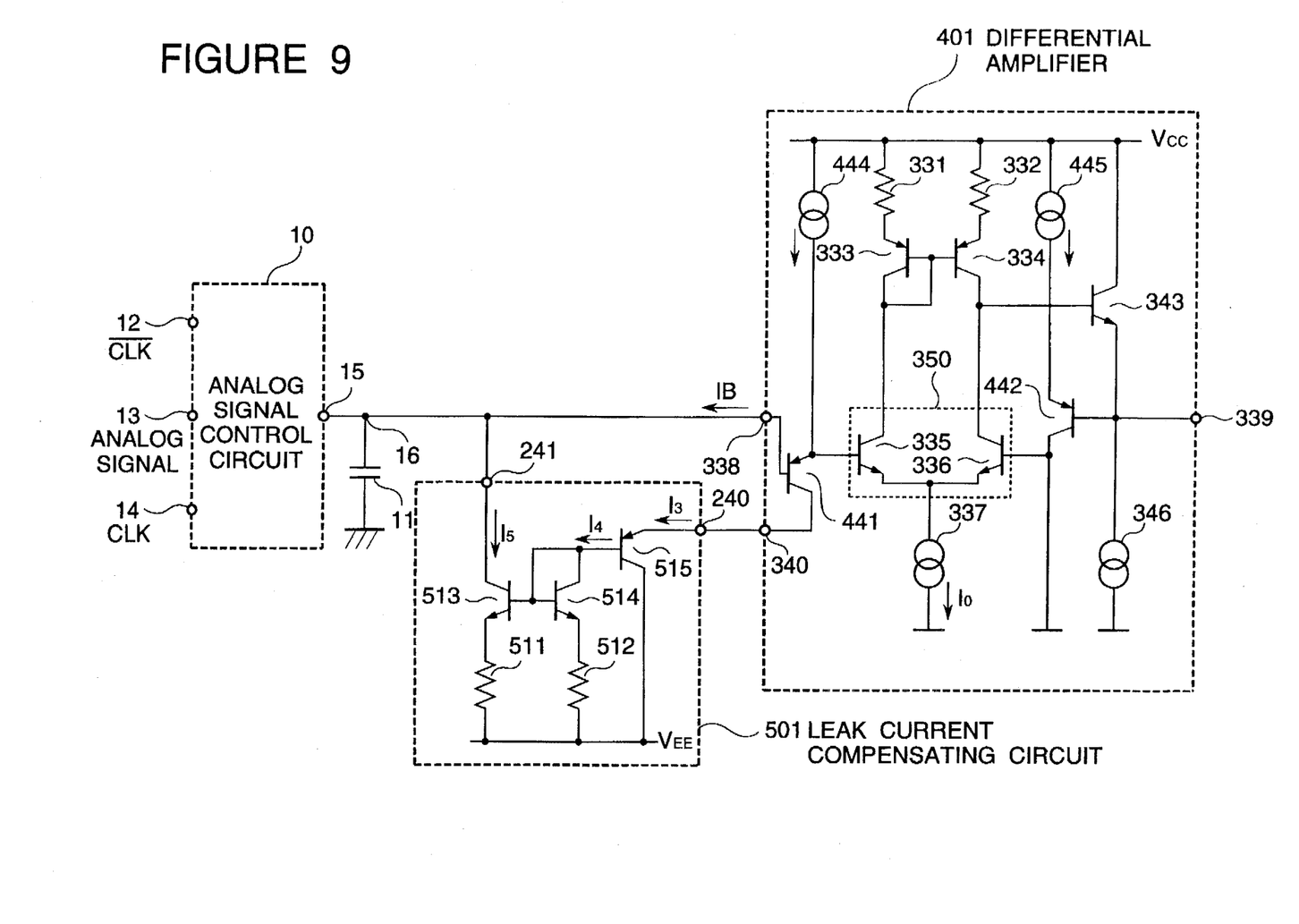
FIG. 9 is a circuit diagram of a sixth embodiment of the sample-and-hold circuit in accordance with the present invention.

As seen from comparison between FIGS. 4 and 9, the sixth embodiment of the sample-and-hold circuit in accordance with the present invention includes a differential amplifier 401 in place of the differential amplifier and a leak current compensating circuit 501 in place of the leak current compensating circuit 201.

The differential amplifier 401 includes a PNP transistor 441 in place of the NPN transistor 341 in the differential amplifier 301, and a PNP transistor 442 in place of the transistor 342 in the differential amplifier 301. Furthermore, the constant current source 344 is replaced with a constant current source 444 having the same current capacity as that of the constant current source 344 and connected between the high potential power supply voltage Vcc and an emitter of the transistor 441, and the constant current source 345 is replaced with a constant current source 445 having the same current capacity as that of the constant current source 345 and connected between the high potential power supply voltage Vcc and an emitter of the transistor 442. Thus, the emitter follower is realized by inverting the polarity of the transistor 341, and the construction other than the above mentioned matters is the same as the differential amplifier 301 of the first embodiment.

The leak current compensating circuit 501 is configured to meet with the emitter follower transistor 441 which corresponds to polarity inversion of the transistor 341. For this purpose, the NPN transistor 215 and the PNP transistors 213 and 214 are replaced by a PNP transistor 515 and NPN transistors 513 and 514, respectively. The resistors 211 and 212 are respectively replaced with a resistor 511 having one end connected to a low potential power supply voltage $V_{EE}$ and the other end connected to an emitter of the transistor 513 and a resistor 512 having one end connected to the low potential power supply voltage $V_{EE}$ and the other end connected to an emitter of the transistor 514. Therefore, the leak current compensating circuit 501 operates in a polarity opposite to that of the leak current compensating circuit 201.

The sample-and-hold circuit of the sixth embodiment is the same in operation as the sample-and-hold circuit of the first embodiment, excepting that currents $I_3$, $I_4$ and $I_5$ in the leak current compensating circuit 501 are opposite to those in the leak current compensating circuit 201. Therefore, a detailed explanation will be omitted. In addition, the sample-and-hold circuit of the second to fifth embodiments can be realized by replacing the differential amplifiers 301 with the differential amplifier 401, and also by replacing the NPN transistors and the PNP transistors in the leak current compensating circuits 202 to 205 by PNP transistors and NPN transistors, in a manner similar to the leak current compensating circuit 501, and further by replacing the high potential power supply voltage Vcc by the low potential power supply voltage $V_{EE}$.

Namely, it would be apparent that the leak current compensating circuit of the present invention can be replaced by inverting the polarity of the power supply As seen from the above, the present invention can provide a sample-and-hold circuit of a full bipolar transistor construction having a leak current compensating circuit of an extremely high precision and a small power consumption. In addition, since it is possible to quickly compensate for the leak current, it is possible to speed up the sample-and-hold operation of an analog signal.

Furthermore, when the sample-and-hold circuit of the present invention is realized on a semiconductor integrated circuit, since all constituents can be formed of bipolar transistors, a process for manufacturing the semiconductor integrated circuit can be very simplified.

The invention has thus been shown and described with reference to the specific embodiments. However, it should be noted that the present invention is in no way limited to the details of the illustrated structures but changes and modifications may be made within the scope of the appended claims.

We claim:

1. A sample-and-hold circuit comprising:
   a first means for supplying a potential of an input signal to one end of a hold capacitor, and another end of said hold capacitor being connected to a first supply voltage;
   a first transistor having a base connected to the one end of said hold capacitor and operating in an emitter follower fashion;
   an amplifier circuit having a second transistor having a base connected to an emitter of said first transistor, wherein said amplifier outputs an amplified potential corresponding to the potential supplied to the one end of the hold capacitor;
   a third transistor having an emitter connected to a collector of said first transistor, said third transistor having a collector connected to a second supply voltage; and
   a second means for supplying to said base of said first transistor the same current as a base current of said third transistor, wherein the second means is connected to the base of the third transistor.

2. A sample-and-hold circuit claimed in claim 1 wherein said second means includes a current mirror circuit having an input path receiving said base current of said third transistor and an output path for supplying said base current of said first transistor.

3. A sample-and-hold circuit claimed in claim 2 wherein said second means includes a fourth transistor connected between said output path of said current mirror circuit and said base of said first transistor, a base of said fourth transistor being connected to said collector of said first transistor.

4. A sample-and-hold circuit claimed in claim 1, wherein said second means includes a current mirror circuit having a first path connected to said bass of said third transistor and a fourth transistor having an emitter connected to a second path of said current mirror circuit and a collector connected to said base of said first transistor, a base of said fourth transistor being connected to said first path of said current mirror circuit.

5. A sample-and-hold circuit comprising:
   an analog signal control circuit having an input and an output, wherein said input receives an input potential and said output provides a signal corresponding to the input potential;
   a hold capacitor, one end of said hold capacitor being connected to the output of the analog signal control circuit, for holding the signal corresponding to the input potential, another end of said hold capacitor being connected to a first supply voltage;
   a leak current compensating circuit comprising:
      a detecting terminal,
      a current mirror circuit for detecting a first current output and providing a second current output, wherein the second current output mirrors the first current output,
      a first transistor having an emitter connected to said detecting terminal, a collector connected to a second supply voltage and a base connected to the first current output, and
      an output terminal, connected to said second current output, for supplying a compensating current;

a differential amplifier circuit comprising:

a second transistor having a base connected to said hold capacitor for receiving the held signal, said second transistor having a collector connected to said detecting terminal, and an emitter connected in an emitter-follower fashion, a third transistor, said third transistor having a base connected to said emitter of said second transistor; and an output, connected to said differential amplifier circuit, for outputting a potential corresponding to the held signal.

6. A sample-and-hold circuit claimed in claim 5, wherein the leak current compensating circuit further comprises a fourth transistor having an emitter connected to said second current output, a collector connected to said output terminal, and a base connected to said emitter of said first transistor.

7. A sample-and-hold circuit claimed in claim 5, wherein the leak current compensating circuit further comprises a fourth transistor having an emitter connected to said second current output, a collector connected to said output terminal, and a base connected to said base of said first transistor.

8. A method for sampling and holding an input potential, said method comprising the steps of:

sampling the input potential;

holding the input potential on a hold capacitor;

providing the held input potential from the hold capacitor to a differential amplifier by way of a transistor operating in an emitter follower fashion, said transistor having a base connected to receive the held input potential;

detecting the leakage current from a collector of the transistor;

maintaining the held input potential on the hold capacitor by supplying a compensation current to the hold capacitor equal to the detected leakage current; and providing an output of the differential amplifier as an output signal corresponding to the sampled and held input potential.

* * * * *